United States Patent
Stagaman et al.

[11] Patent Number: 5,888,908
[45] Date of Patent: Mar. 30, 1999

[54] METHOD FOR REDUCING REFLECTIVITY OF A METAL LAYER

[75] Inventors: Gregory Joseph Stagaman, Dallas; Michael Edward Haslam, Highland Village, both of Tex.

[73] Assignee: STMicroelectronics, Inc., Carrollton, Tex.

[21] Appl. No.: 430,220

[22] Filed: Apr. 28, 1995

Related U.S. Application Data

[62] Division of Ser. No. 316,815, Oct. 3, 1994, abandoned, which is a continuation of Ser. No. 876,370, Apr. 30, 1992, abandoned.

[51] Int. Cl.$^6$ .................................................. H01L 21/00
[52] U.S. Cl. ........................ 438/720; 438/718; 438/722; 438/723
[58] Field of Search ........................ 437/228, 245, 437/246, 189, 192; 427/569, 579; 156/643.1, 644.1, 625.1, 646.1; 216/37, 58, 67; 438/694, 695, 718, 720, 722, 723, 964

[56] References Cited

U.S. PATENT DOCUMENTS

| | | | |
|---|---|---|---|
| 3,930,857 | 1/1976 | Bendz et al. | 96/36.2 |
| 4,098,917 | 7/1978 | Bullock et al. | 427/36 |
| 4,377,633 | 3/1983 | Abrahamovich et al. | 430/312 |
| 4,478,209 | 10/1984 | Guarnieri | 126/417 |
| 4,554,727 | 11/1985 | Deckman et al. | 437/180 |
| 4,681,795 | 7/1987 | Tuckerman | 428/209 |
| 4,695,868 | 9/1987 | Fisher | 357/68 |
| 4,710,254 | 12/1987 | Garlick | 156/278 |
| 4,714,668 | 12/1987 | Uneno et al. | 430/316 |
| 4,802,737 | 2/1989 | Denton | 350/166 |
| 4,933,304 | 6/1990 | Chen et al. | 437/194 |
| 5,027,176 | 6/1991 | Saika et al. | 357/30 |
| 5,032,209 | 7/1991 | Shinbach et al. | 156/272.6 |
| 5,061,604 | 10/1991 | Ouderkirk et al. | 430/296 |
| 5,139,974 | 8/1992 | Sandhu et al. | 437/228 |
| 5,159,172 | 10/1992 | Goodman et al. | 219/151.68 |
| 5,213,659 | 5/1993 | Blalock et al. | 156/643 |
| 5,324,543 | 6/1994 | Ogawa et al. | 427/387 |
| 5,477,105 | 12/1995 | Curtin et al. | 313/422 |

FOREIGN PATENT DOCUMENTS

| | | | |
|---|---|---|---|
| 58-018972 | 2/1983 | Japan | 257/437 |
| 0247574 | 10/1987 | Japan | 257/437 |
| 62-247574 | 10/1987 | Japan | 257/437 |
| 63-232447 | 9/1988 | Japan | 257/775 |

*Primary Examiner*—R. Bruce Breneman
*Assistant Examiner*—Luz L. Alejandro
*Attorney, Agent, or Firm*—Kenneth C. Hill; Theodore E. Galanthay; Lisa K. Jorgenson

[57] ABSTRACT

A method is provided for reducing the reflectivity of a metal layer prior to photolithography. A thin buffer layer, such as oxide, can be deposited over the metal layer. A short plasma etch is performed in order to roughen, but not completely remove, the thin oxide layer. This roughened layer significantly reduces the reflectivity of the underlying metal layer. As an alternative, the brief plasma etch can be applied directly to the metal layer, which results in a significant roughening of its upper surface. This also reduces the reflectivity of the metal layer.

13 Claims, 1 Drawing Sheet

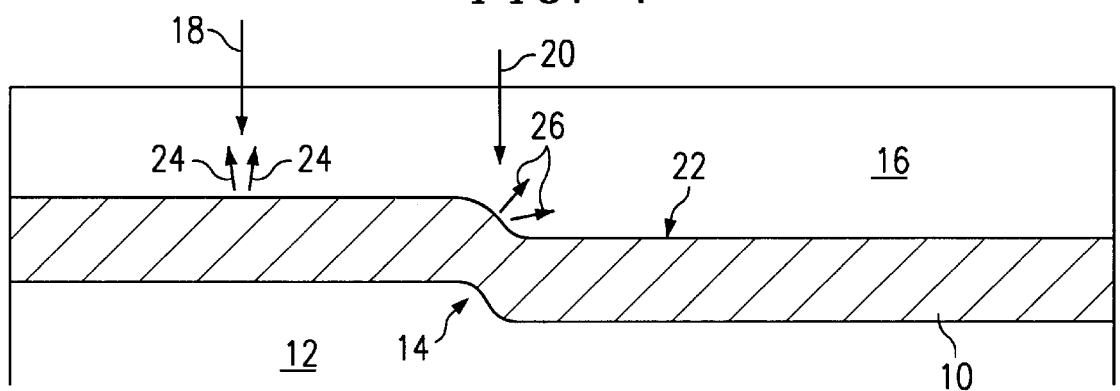
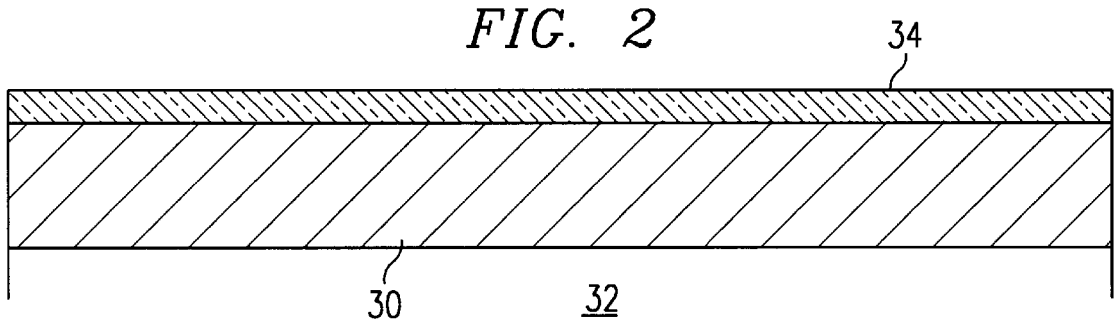
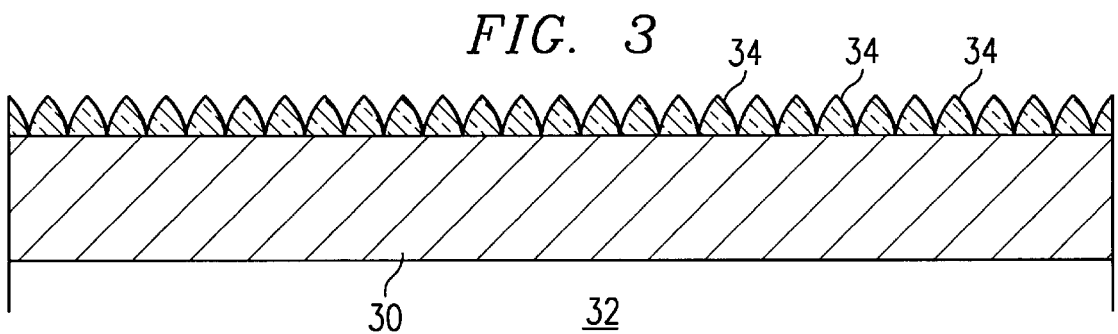
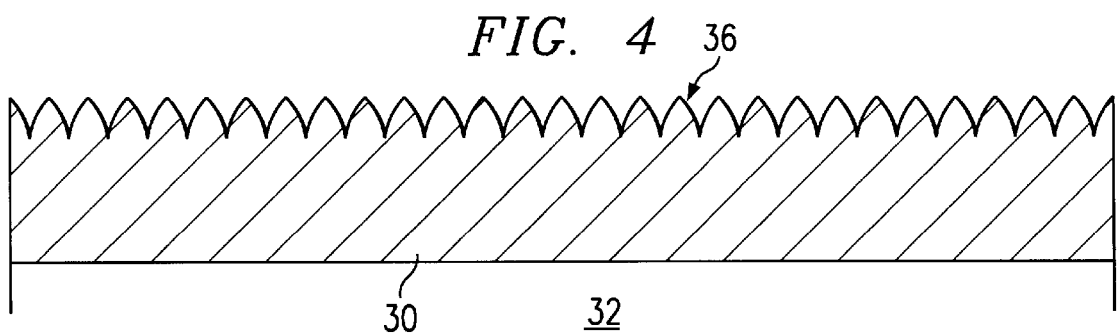

METHOD FOR REDUCING REFLECTIVITY OF A METAL LAYER

This is a Division of application Ser. No. 08/316,815, filed Oct. 3, 1994, which is a continuation of application Ser. No. 07/876,370, filed Apr. 30, 1992, both now abandoned.

BACKGROUND OF THE INVENTION

1. Field of the Invention

The present invention relates generally to the fabrication of semiconductor integrated circuits, and more specifically to a technique for improving photomasking processes.

2. Description of the Prior Art

The processing of semiconductor integrated circuits includes multiple steps of masking and etching various layers which have been deposited over a substrate and other earlier deposited layers. Photoresist is used for these masking steps. When a layer of photoresist is exposed to light of a proper frequency, such as ultraviolet for example, a physical change occurs in the polymers of the resist. After exposure using a mask as a pattern, the undesired portions of the resist are washed away using a chemical solvent. Those portions washed away may be either the unexposed or exposed portions, depending upon whether a positive or negative resist was used. The pattern of the photomask is thus transferred to the resist, which is used as an etch mask for the underlying layer or layers.

Problems can arise when resist is used in this manner as a mask to pattern layers of materials having a high reflectivity which have been deposited over the device. Metal layers are especially troublesome in this respect. Such metal layers are typically used as metal interconnect layers. Aluminum is a typical metal used for this purpose. A problem results during photolithography because metals such as aluminum are highly reflective, causing the light used to expose the resist to reflect back into the resist and further expose it. Since, in general, the light is not traveling perfectly perpendicularly to the upper surface of the metal layer, it is reflected at an angle to the side of the desired region. This is especially true where the metal layer passes over steps and other uneven topographical features. Since adjacent portions of the resist become exposed by the reflected light, accurate control of feature sizes is extremely difficult when patterning metal layers.

A number of approaches have been used to solve the reflectivity problem, but most such techniques introduce undesirable issues as side effects. It is not possible merely to reduce the intensity of the light used to expose the resist, because this can result in underexpose of some portions of the resist layer. Some techniques have used a thinner layer of photoresist in order to minimize the unwanted side effects from reflection off of the metal layer. However, the thinner resist layer is less effective as a mask for later etching steps. Also, the use of multiple resist layers introduces additional complexity into the process flow. Some techniques for using anti-reflective coatings have been used, but these often introduce additional processing complexity or provide only a partial solution to the problem.

It would be desirable to provide a technique for reducing the reflectivity of a metal layer prior to the deposition and patterning of a photoresist masking layer.

SUMMARY OF THE INVENTION

Therefore, according to the present invention, a method is provided for reducing the reflectivity of a metal layer prior to photolithography. A thin buffer layer, such as oxide, can be deposited over the metal layer. A short plasma etch is performed in order to roughen, but not completely remove, the thin oxide layer. This roughened layer significantly reduces the reflectivity of the underlying metal layer. As an alternative, the brief plasma etch can be applied directly to the metal layer, which results in a significant roughening of its upper surface. This also reduces the reflectivity of the metal layer.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIG. 1 illustrates a portion of a semiconductor integrated circuit device during processing;

FIGS. 2 and 3 illustrate a processing technique for the integrated circuit according to a first embodiment of the present invention; and FIG. 4 illustrates an alternative embodiment of the present invention.

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

FIG. 1 illustrates scattering from a high reflective metallic surface during exposure of photoresist. As shown in FIG. 1, aluminum layer 10 rests on an underlying insulating layer 12. Insulating layer 12 covers underlying layers (not shown), the fabrication of which is conventional. Insulating layer 12 is generally planar, but has a step 14 caused by uneven topography of the underlying layers. This step 14 is reflected in the aluminum layer 10, which is conformal and follows the topography of the insulating layer 12.

A layer of photoresist 16 overlies the aluminum layer 10, and has a substantially planar upper surface. The photoresist layer 16 will be exposed by electromagnetic radiation, which is masked as known in the art.

Electromagnetic radiation used to expose the photoresist 16 impinges more or less vertically upon the device as represented by arrows 18 and 20. However, the impinging radiation is not oriented perfectly vertically, and typically strikes the upper surface 22 of the aluminum layer 10 at a slight angle. Since the angle of reflection is equal to the angle of incidence, the reflected light tends to scatter somewhat to the side as indicated by arrows 24. As is known in the art, this causes regions of photoresist to become exposed which are adjacent to regions which are intended to be become exposed.

Arrow 20 indicates radiation impinging upon the aluminum upper surface 22 in the region of the step 14. As indicated by arrows 26, this causes reflected radiation to scatter at a large angle from the incident light. This can cause relatively large regions of photoresist adjacent to step regions to become exposed when such is not desired. Decreasing the reflectivity of the upper surface 22 will greatly reduce the adverse effects due to scattered radiation.

FIGS. 2 and 3 illustrate a preferred technique for reducing the reflectivity of the aluminum layer upper surface. Referring to FIG. 2, a layer of aluminum 30 is formed over an underlying insulating layer 32. A thin layer 34 is deposited over the aluminum layer 30. The thin layer 34 is typically undoped oxide, but may be another material such as nitride, oxynitride, etc. Thin layer 34 preferably has a thickness of between approximately 200 and 2000 angstroms.

Referring to FIG. 3, a plasma etch is performed over the entire surface of the device. This etch is a plasma etch, and is performed for a length of time which removes a portion, but not all, of the thin layer 34. Since the plasma etch tends to remove the oxide layer somewhat unevenly, a rough upper surface for the thin layer 34 results. The size of the ridges and grooves of FIG. 3 are greatly exaggerated in order to emphasize the roughness of the layer 34.

Since this layer 34 is so rough, it greatly reduces the reflectivity of the aluminum layer 30 even though the layer 34 itself is relatively transparent. Impinging radiation is reflected and refracted through the irregularly shaped facets of the layer 34, causing it to scatter internally and greatly diminish the amount of light undesirably scattered back into the photoresist.

FIG. 4 shows a variation on the above-described technique which also diminishes the amount of reflected light. In the method of FIG. 4, the layer 34 is not deposited, and a short plasma etch is performed to roughen the upper surface of the aluminum layer itself. This results in a rough upper surface 36, which has approximately the same benefits as described above. To some extent, the roughness of the aluminum layer 30 results if the overlying layer 34 is deposited but completely etched away. This means that the etch time for the plasma that is used to remove layer 34 in the process of FIG. 2 and 3 is not critical.

As will be appreciated by those skilled in the art, the use of a plasma etch to roughen the upper surface of the metallic layer, whether or not covered by a thin oxide layer, adds relatively little complexity to the overall process flow. In return for this very minor addition of complexity, the problems caused by reflectance of the upper surface of the aluminum layer are greatly reduced.

The techniques described above are useful with metal layers other than aluminum. For example, if a refractory metal layer is deposited and patterned, similar problems due to reflection of electromagnetic radiation occur. The technique described above can be used with these layers as well as with aluminum interconnect layers. Although the use of a thin oxide layer 34 was described in the first embodiment, a different material can be used for this layer if doing so is more compatible with any given process flow.

While the invention has been particularly shown and described with reference to a preferred embodiment, it will be understood by those skilled in the art that various changes in form and detail may be made therein without departing from the spirit and scope of the invention.

What is claimed is:

1. A method for reducing a reflectivity of a metal surface during semiconductor processing, comprising the steps of:

depositing a metal layer over a integrated circuit device;

depositing a thin buffer layer over the metal layer; and plasma etching the buffer layer to remove a portion thereof, wherein such etching step roughens an upper surface of the remaining portions of the buffer layer.

2. The method of claim 1, wherein the buffer layer comprises a layer of oxide.

3. The method of claim 1, wherein the metal layer comprises aluminum.

4. The method of claim 1, wherein the layer of metal comprises a refractory metal.

5. The method of claim 1, further comprising the steps of:

depositing a layer of photoresist over the roughened buffer layer upper surface; and exposing the photoresist layer to electromagnetic radiation.

6. A method for reducing a reflectivity of a metal surface during semiconductor processing, comprising the steps of:

depositing a metal layer over an integrated circuit device;

depositing a dielectric layer over the metal layer;

plasma etching the dielectric layer to remove a small portion from its upper surface, wherein a remaining upper surface of the dielectric layer is roughened;

depositing a layer of photoresist over the roughened upper surfaced; and exposing the photoresist layer to electromagnetic radiation.

7. The method of claim 6, wherein the metal layer comprises aluminum.

8. The method of claim 6, wherein the step of depositing a metal layer over the integrated circuit device further comprises:

depositing an aluminum layer.

9. The method of claim 6, wherein the step of depositing a metal layer over the integrated circuit device further comprises:

depositing a layer of refractory metal.

10. The method of claim 6, wherein the step of depositing a dielectric layer over the metal layer further comprises:

depositing an undoped oxide layer.

11. The method of claim 6, wherein the step of depositing a dielectric layer over the metal layer further comprises:

depositing an nitride layer.

12. The method of claim 6, wherein the step of depositing a dielectric layer over the metal layer further comprises:

depositing an oxynitride layer.

13. The method of claim 6, wherein the step of depositing a dielectric layer over the metal layer further comprises:

depositing a dielectric layer to a thickness of between approximately 200 and 2000 angstroms.

* * * * *